US009338579B2

(12) United States Patent
Haack et al.

(10) Patent No.: US 9,338,579 B2
(45) Date of Patent: May 10, 2016

(54) DEVICE AND METHOD FOR SIMULATING SPATIAL SOUND

(71) Applicant: SHURE EUROPE GMBH, Eppingen (DE)

(72) Inventors: Torsten Haack, Eppingen (DE); Jens Stellmacher, Eppingen (DE); Markus Winkler, Eppingen (DE)

(73) Assignee: Shure Europe GMBH (DE)

(*) Notice: Subject to any disclaimer, the term of this patent is extended or adjusted under 35 U.S.C. 154(b) by 37 days.

(21) Appl. No.: 14/361,209

(22) PCT Filed: Nov. 28, 2012

(86) PCT No.: PCT/DE2012/001138
§ 371 (c)(1),
(2) Date: May 28, 2014

(87) PCT Pub. No.: WO2013/079051
PCT Pub. Date: Jun. 6, 2013

(65) Prior Publication Data

US 2014/0314240 A1 Oct. 23, 2014

(30) Foreign Application Priority Data

Nov. 28, 2011 (DE) ........................ 10 2011 119 642

(51) Int. Cl.
*H03G 3/00* (2006.01)
*H04S 7/00* (2006.01)

(52) U.S. Cl.
CPC . *H04S 7/305* (2013.01); *H04S 7/40* (2013.01); *H04R 2227/007* (2013.01); *H04S 2400/11* (2013.01); *H04S 2400/15* (2013.01); *H04S 2420/13* (2013.01)

(58) Field of Classification Search
None
See application file for complete search history.

(56) References Cited

U.S. PATENT DOCUMENTS 5,452,360 A 9/1995 Yamashita et al.

OTHER PUBLICATIONS

Silzle Andreas et al: "IKA-SIM: A System to Generate Auditory Virtual Environments" AES Convention 116; May 2, 2004. AES. 60 East 42nd Street. Room 2520 New York 10165-2520. USA. May 1, 2004. XP040506806, 24 pages.
Teutsch H et al: "An integrated real-time system for immersive audio applications" Applications of Signal Processing to Audio and Acoustics. 2003 IEEE Workshop on. New Paltz, NY, USA Oct. 19-22, 2003, Piscataway, NJ, USA, IEEE, Oct. 19, 2003, pp. 67-70, XP010696454, DOI: 10.1109/ASPAA.2003.1285821, ISBN: 978-0-7803-7850-6, 4 pages.

(Continued)

*Primary Examiner* — Regina N Holder
(74) *Attorney, Agent, or Firm* — Banner & Witcoff, Ltd.

(57) ABSTRACT

The invention relates to a system for simulating stereophonic sound (1), comprising the following: a core module (10) having a space simulation module (11), an echo module and an interface module (15), a control module (20), a digital audio delay matrix module (21), and a digital audio/network system (30). The invention is characterized in that said system provides an echo and/or directional acoustic irradiation on the basis of a system latency less than 2.5 ms by means of the core module (10), the control module (20), and the digital audio network system. A system for simulating stereophonic sound is thus provided, which system operates with a reduced number of loudspeakers and without dedicated components and/or proprietary hardware and provides a plurality of different functions, such as extension of the echo time and directional acoustic irradiation.

17 Claims, 8 Drawing Sheets

(56) References Cited

OTHER PUBLICATIONS

Sladeczek Christoph et al: "Audio Network Based Massive Multichannel Loudspeaker System for Flexible Use in Spatial Audio Research" Conference: 44th International Conference: Audio Networking; Nov. 2011. AES. 60 East 42nd Street, Room 2520 New York 10165-2520, USA, Nov. 18, 2011. XP040567683, 10 pages.
Elizabeth M. Wenzel: "Analysis of the Role of Update Rate and System Latency in Interactive Virtual Acoustic Environments", Sep. 26, 1997, pp. 1-14, XP055059634, AES 103rd Convention 1997 5 Sep. 26-29 New York, USA. Retrieved from the Internet: URL: http://www.aes.org/tmpFiles/elib/20130, 412/7146.pdf[retrieved on Apr. 15, 2013], 14 pages.
Staff et al: "The Next Generation of Audio Communications", JAES. AES. 60 East 42nd Street, Room 2520 New York 10165-2520, USA, vol. 54, No. 9, Sep. 1, 2006, pp. 865-867, XP040507994, 4 pages.
International Search Report, ISR English Translation and Written Opinion dated Apr. 22, 2013 (PCT/DE2012/001138); 11 pages.
International Search Report and Written Opinion dated Apr. 22, 2013 (PCT/DE2012/001138); ISA/EP.
Silzle Andreas et al: "IKA-SIM: A System to Generate Auditory Virtual Environments" AES Convention 116; May 2004. AES. 60 East 42nd Street. Room 2520 New York 10165-2520. USA. May 1, 2004. XP040506806, the whole document.
Teutsch H et al: "An integrated real-time system for immersive audio applications" Applications of Signal Processing to Audio and Acoustics. 2003 IEEE Workshop on. New Paltz, NY, USA Oct. 19-22, 2003, Piscataway, NJ, USA, IEEE, Oct. 19, 2003, pp. 67-70, XP010696454, DOI: 10.1109/ASPAA.2003.1285821, ISBN: 978-0-7803-7850-6 the whole document.
Sladeczek Christoph et al: "Audio Network Based Massive Multichannel Loudspeaker System for Flexible Use in Spatial Audio Research" Conference: 44th International Conference: Audio Networking; Nov. 2011. AES. 60 East 42nd Street, Room 2520 New York 10165-2520, USA, Nov 18, 2011. XP040567683, the whole document.
Elizabeth M. Wenzel: "Analysis of the Role of Update Rate and System Latency in Interactive Virtual Acoustic Environments", Sep. 26, 1997, pp. 1-14, XP055059634, AES 103rd Convention Sep. 26-29, 1997 New York, USA. Retrieved from the Internet: URL:http://www.aes.org/tmpFiles/elib/20130412/7146.pdf [retrieved on Apr. 15, 2013] the whole document.
Staff et al: "The Next Generation of Audio Communications", JAES. AES. 60 East 42nd Street, Room 2520 New York 10165-2520, USA, vol. 54, No. 9, 1 Sep. 1, 2006, pp. 865-867, XP040507994, the whole document.

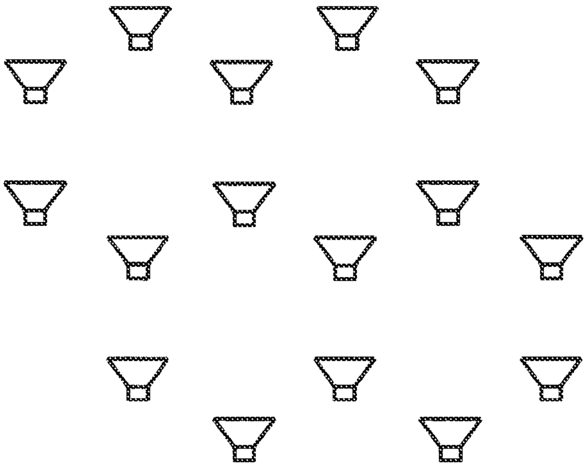
Figure 7c
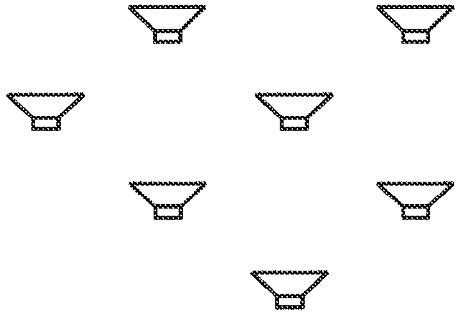
Figure 7b
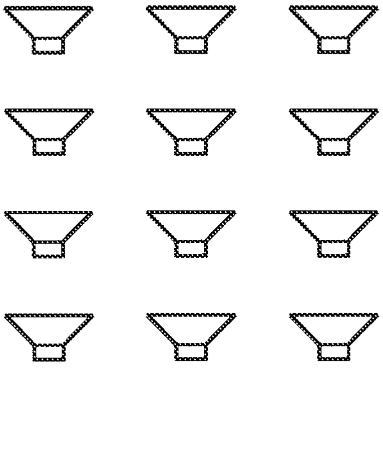
Figure 7a
Figure 7

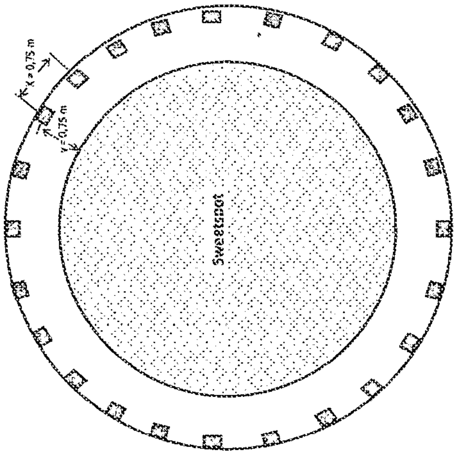
Figure 8a
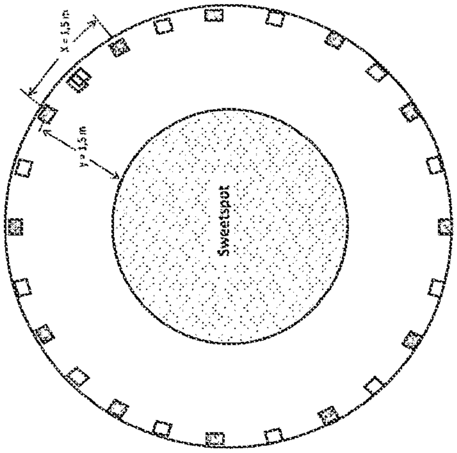
Figure 8b
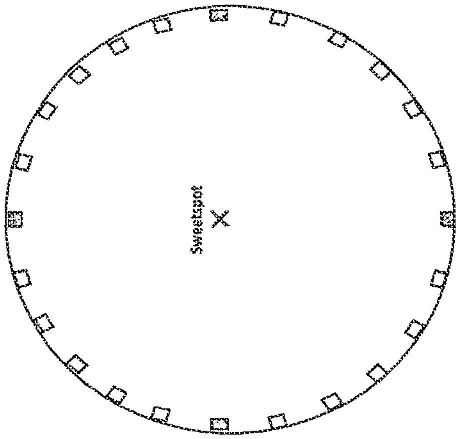
Figure 8c
Figure 8

DEVICE AND METHOD FOR SIMULATING SPATIAL SOUND

CROSS-REFERENCE TO RELATED APPLICATIONS

The present application is a U.S. National Phase filing of International Application No. PCT/DE2012/001138, filed on Nov. 28, 2012, designating the United States of America and claiming priority to German Patent Application No. 10 2011 119 642.4, filed Nov. 28, 2011, and this application claims priority to and the benefit of the above-identified applications, which are both incorporated by reference herein in their entireties.

FIELD

The present disclosure relates to a system for simulating spatial sound, a method and a use of the system for simulating spatial sound which enables an extension of the echo time and/or a directional acoustic irradiation.

BACKGROUND

In modern audio playback systems individual audio sources can be located in space by the use of a plurality of loudspeakers.

In principle there are two different playback concepts for this purpose. In the conventional surround-sound systems which are usual in the cinema and home entertainment sector, the location and space information is already mixed during the audio mixing operation into individual channels to be transmitted separately, and with a playback system consisting of a plurality of loudspeakers the individual channels are played back. In this case the reproducing loudspeakers must be placed at a position relative to the listener predetermined according to the recording in order to achieve an impression of space.

More advanced systems for stereo simulations generate the control signals for the individual loudspeakers only during the reproduction, based upon position information of a sound source with respect to the playback space and the space information of a playback environment to be simulated. The systems are based on the wave field synthesis (WFS). This involves a three-dimensional audio playback process for generating virtual acoustic environments. In this case wavefronts emanating from a virtual point are generated, of which the acoustic location is not dependent upon a listener's position. The WFS is based on the Huygens principle, according to which each wavefront may also be regarded as a superimposition of elementary waves. Thus any wavefront can be synthesised from these elementary waves. For this purpose, by further means a computer program controls individual loudspeakers arranged around the listener for sound wave generation at exactly the time at which a virtual wavefront would have run through its point in space.

The mathematical basis for this is the Kirchhoff-Helmholtz integral. This states that the sound pressure is determined at every point within a source-free volume if the sound pressure and sound particle velocity are determined at all points on its surface. Thus every sound field can be reconstructed if the sound pressure and sound particle velocity are reconstructed on all points on the surface of the volume. For this purpose, however, the entire surface of the volume, that is to say all walls, ceilings and preferably floors of the playback space would have to be equipped with closely packed sound generators. Furthermore all sound generators, with their respective signal, would have to be individually controlled. In addition the space would have to be completely soundproof in order to meet the condition of the source-free volume.

Thus three-dimensional audio playback systems based on wave field synthesis produce an impression of natural and spatial sound with the aid of many loudspeakers disposed close together. Because of the high requirements with regard to space, number of loudspeakers and computing power, as a rule only proprietary systems produced, which may be appropriate only for a dedicated application (for example extension of the echo time). Furthermore conventional systems have dedicated components for signal transmission, directional processing and spatial processing, which may lead to significantly higher system latencies and to a high system price. In addition various A/D and D/A conversions can have poorer signal-to-noise ratios.

A method for controlling a sound reproduction system which is designed in order to produce an impression of spatial sound is known from EP 1 878 308 B1. In this connection a very large number of loudspeakers disposed adjacent to one another (a so-called loudspeaker array) is used for one listener. In this case the orientation of the loudspeakers is 360° in a horizontal arrangement. However, this method may need a very large number of loudspeakers and dedicated hardware.

A system for simulating spatial sound is provided, which can operate with a reduced number of loudspeakers and without dedicated components and/or proprietary hardware, and a plurality of different functions, such as extension of the echo time and directional acoustic irradiation.

This object is achieved by a system for simulating spatial sound with the features of Claim 1. Advantageous embodiments and modifications of the disclosure are described in the subordinate claims.

A system for simulating spatial sound is provided, which may include the following:

- a core module with a stereo simulation module simulation module, an echo module and an interface module,
- a control module,
- a digital audio delay matrix module and
- a digital audio/network system.

Thus, a plurality of audio signals can be reproduced with regard to amplitude and time with a system latency less than 2.5 ms by means of a plurality of loudspeakers. In this case the system latency encompasses the complete system, from the sound source to the loudspeaker, that is to say also the amplifier, I/O modules, equaliser, signal converter, etc. On the basis of the limited latency period of <2.5 ms the system is significantly easier to handle, in particular when measuring in relation to feedback. In this case, the limited latency period is a prerequisite in order also to provide directional acoustic irradiation in addition to echo or extension of echo. The substantial superiority of this system comes to light primarily in live performances, where synchronicity between the audio signal and the gestures of the actor plays an important role. Furthermore, actors moving in the sound field of the loudspeaker are not perceived as their own echo, as in the case of a system subject to latency.

The core module controlled by the control module has a synthetic echo module for generating a synthetic echo and a regenerative echo module for generating a regenerative echo. In this connection the synthetic echo can be mixed as required with the regenerative echo. The regenerative echo module is also controlled inter alia by microphones.

The echo or the extension of the echo time and the directional acoustic irradiation in the core module are brought together or merged sequentially or simultaneously.

Furthermore the digital audio/network system may include:

a ceiling-mounted loudspeaker and a wall-mounted loudspeaker, wherein the loudspeakers are oriented substantially horizontally in bands and the horizontal distance between the loudspeakers is substantially less than or equal to 1.5 m relative to one another. In this case this distance is measured from diaphragm center to diaphragm center. In addition the vertical position of the front and wall-mounted loudspeakers is located slightly above the audience. Thus a representative auditory impression is already achieved in a region (sweet spot) from a distance of likewise 1.5 m from the loudspeaker. With a reduced distance or with half the distance of the loudspeakers from one another of 0.75 m, the sweet spot is significantly increased, so that a representative sound experience is already achieved from 0.75 m. In this way the virtual sources can be located better and thus make a clearer impression. Moreover the focus effect of the sources is improved. Furthermore the listener feels as though he is in the virtual sound environment. If the distance of the loudspeakers from one another is increased and thus the number of loudspeakers is reduced, then effects such as audience area, location, focus and enclosure are also reduced.

In this case the loudspeakers can be oriented on a rectangular, rhomboid or honeycomb matrix.

The ceiling-mounted loudspeakers (33*c*) can be oriented on a logarithmic matrix R1 extending in a longitudinal direction of a space (50).

Furthermore, the digital audio/network system may have an I/O module and an amplifier module by which a plurality of loudspeakers can be controlled. With a large number of amplifier modules and I/O modules, in particular up to 512 loudspeakers can be simultaneously controlled individually.

The system for simulating spatial sound may have a tracking system which includes a geodata transmitter and a geodata receiver, by which the position of a sound source in live operation is ascertained and delivered to the control module for conversion.

By means of the tracking system real movements and/or virtual movements can be converted with the system for simulating spatial sound and made audible for the audience.

Due to the configuration of the core module, and thus of the digital audio/network system by means of CAD software, spaces which are treated acoustically so as to have a short echo time and thus good intelligibility of speech, in particular by use of a preset, may have the acoustic attributes for example of a concert hall. Because of the CAD module and the presets the system can be freely scalable and applicable to spaces of all possible sizes and shapes as well as surfaces. Even in the case of greatly split spaces, it is possible to compensate for sound reflections. Symmetry of space is not a prerequisite here. In this case the sound characteristics of a space is simulated and calculated on the basis of the geometric conditions and/or the surface properties, such as for example sound reflection behaviour.

The system for simulating spatial sound may have an open network topology and as a result can be quickly installed and uninstalled. Thus the system can be used both in a fixed installation, for example in a concert hall, and also as a mobile installation at festivals and for example large events. Furthermore, as a result the setting up and dismantling is simplified and thus leads to a saving of time and cost.

By means of acoustic panels and/or acoustic wall parts it is possible in an acoustically inadequate environment to prevent sound from being reflected and/or to prevent the production of echo chambers which cannot be monitored. For this purpose the acoustic panels and/or acoustic wall parts are appropriately positioned in an acoustically inadequate environment. In this case both passive and also active (anti-noise) panels are used. These may have for example a passive sound insulation at certain points.

The system for simulating spatial sound can be used for production of a playback space which corresponds to the generating space acoustically, in particular in the reverberation characteristics. As a result for example a sound characteristic in a building with a long echo, for example a church, in an environment with a short echo, for example an open-air site, can be simulated and vice versa.

BRIEF DESCRIPTION OF THE DRAWINGS

The invention is explained with reference to examples together with the appended drawings. In the drawings:

FIG. 7 shows a schematic representation of the arrangement of the loudspeakers on different matrices; and FIG. 8 shows a schematic representation of the correlation between the number of loudspeakers and the size of the sweet spot.

DETAILED DESCRIPTION

FIGS. 1 to 4 show an example of a system 1 for simulating spatial sound 1 according to certain aspects.

Figure 1:
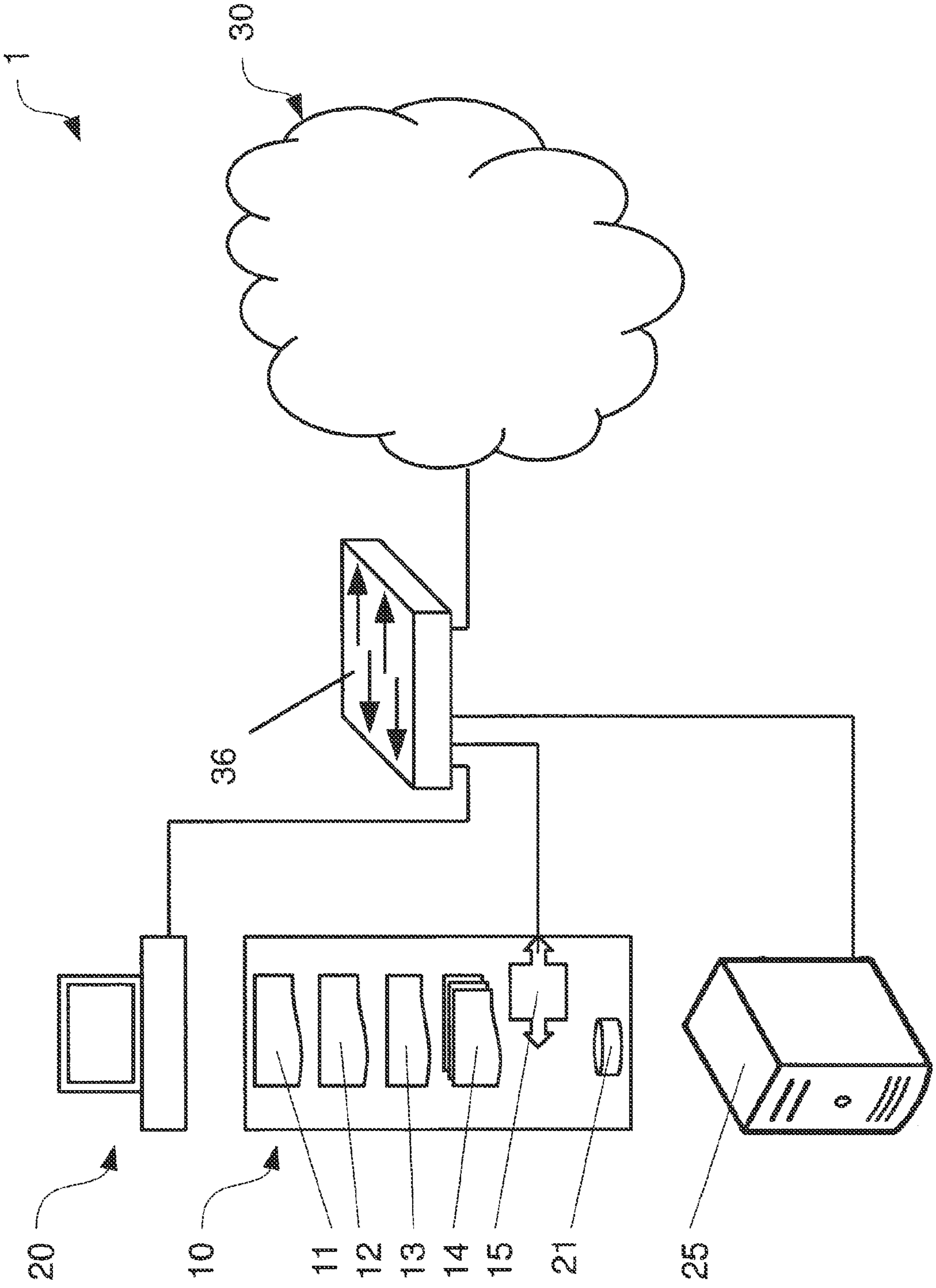
FIG. 1 shows a schematic representation of the system for simulating spatial sound according to one example.

As can be seen in FIG. 1, the system for simulating spatial sound 1 has a core module 10, a control module 20, a CAD module 25 and a digital audio/network system 30. All components are connected to one another by wiring, for example, by Ethernet wiring, by means of a switch 36.

The control module 20 provides a user interface, calculates spatial parameters and transmits the corresponding data via Ethernet to the core module 10.

The core module 10 which is supplied by the control module 20 with corresponding parameters is responsible for the audio processing and controls the entire digital audio/network system 30. A plurality of sound sources 34, in particular up to 32 sound sources 34, can be managed and controlled.

The core module 10 has a stereo simulation module (RSM) 11, a synthetic echo module 12, a regenerative echo module 13, a distributor module 14, a digital audio delay matrix module 21, by which three-dimensional echo values are calculated, and an interface module 15. By the transmitted parameters an echo or an extension of the echo time and/or a directional acoustic irradiation in the stereo simulation module (RSM) 11, the synthetic echo module 12 and the regenerative echo module 13 for a sound source 34 is calculated and thus a three-dimensional acoustic stereo simulation is provided. In this case the synthetic echo and the regenerative echo are processed sequentially or simultaneously in the core module 10. For the stereo simulation parameters a plurality of acoustically measured spaces are employed. As a result for example a sound characteristic in a building with a long echo, for example a church, in an environment with a short echo, for example a concert hall, can be simulated and vice versa. Thus acoustically difficult conditions, for example a large stadium, with a sound experience such as that prevailing in a concert hall can be controlled.

In addition spatial parameters can be adapted and also simulated by means of the control module 20. This can take place by means of a 3D-capable CAD system which calculates the sound characteristics of a space on the basis of the geometric conditions and/or the surface properties, such as for example sound reflection behaviour.

The digital audio/network system 30 comprises an amplifier module 31, an I/O module 32, front loudspeaker 33*a,* wall-mounted loudspeaker 33*b,* in particular a ceiling-mounted loudspeaker 33*c,* a sound source 34, both fixed microphones 35 and also at least one mobile microphone (not shown), LAN cable 37, loudspeaker cable 38 and microphone cable 39. In this case the fixed microphones 35 are used for control of the regenerative echo module 13 for generating a regenerative echo. The mobile microphones are used for example by live actors. In this case a noise which is recorded by the stationary microphones 35 and reproduced by the loudspeakers with a time offset is designated as a regenerative echo.

Figure 2:
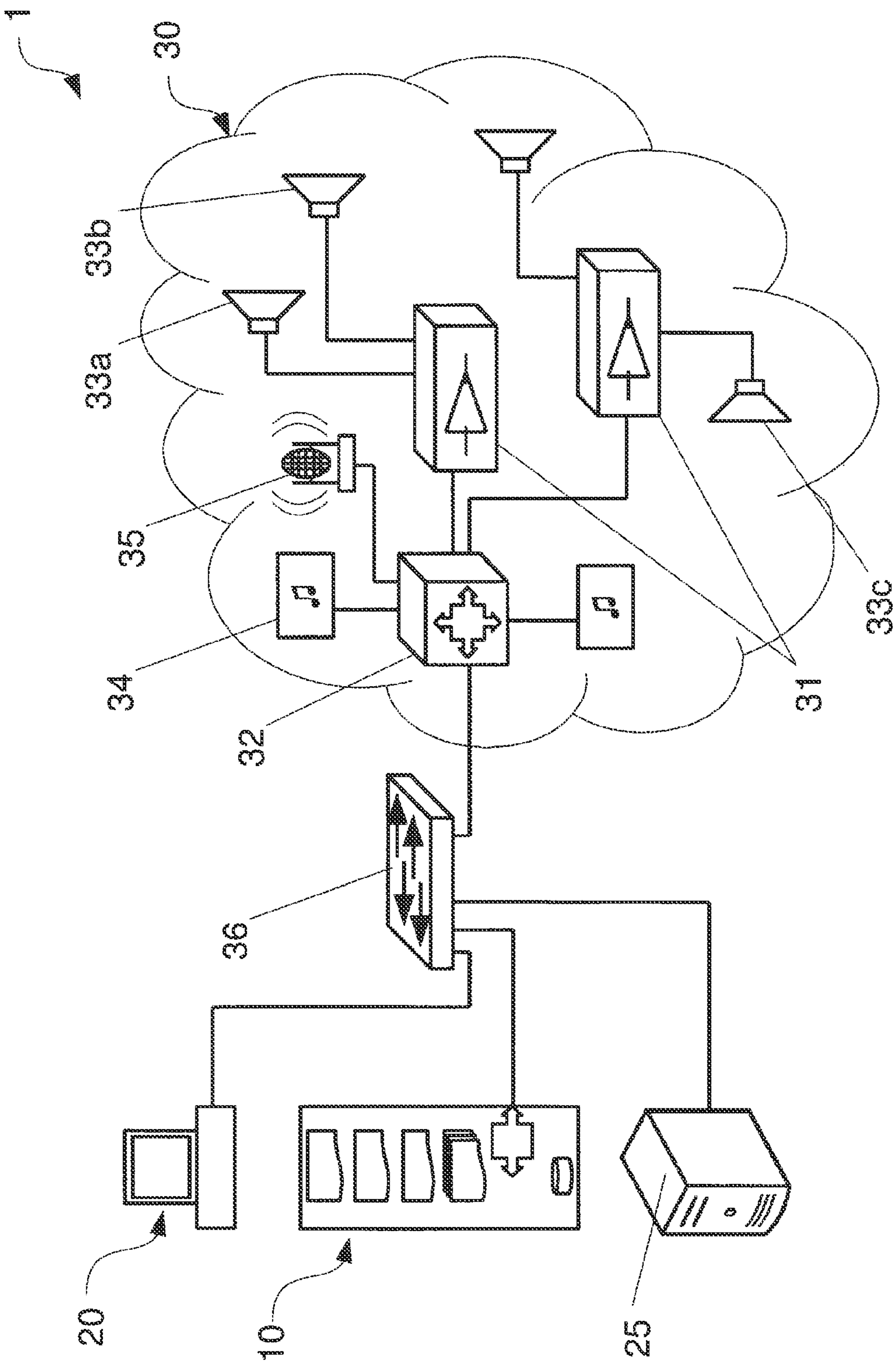
FIG. 2 shows a schematic representation of the system for simulating spatial sound with details of the digital audio/network system according to the example of FIG. 1.
Figure 3:
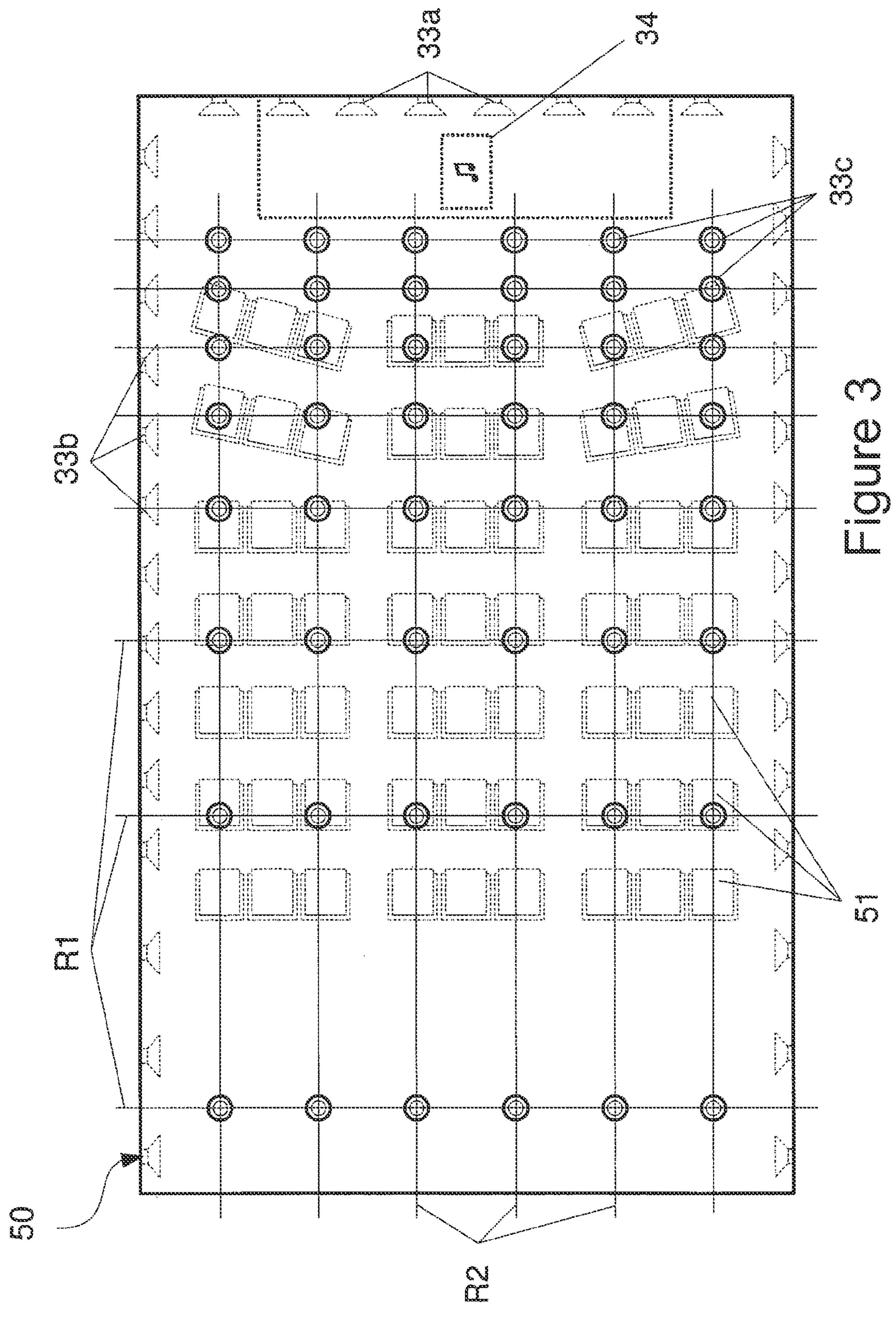
FIG. 3 shows a schematic representation of a space in plan view for the system for simulating spatial sound according to a the example of FIG. 1.

As can be seen from FIG. 2, the input or output means, sound source 34 and amplifier 31 are connected by means of the I/O module 32 which in turn is connected by LAN wiring to the switch 36 and thus also to the core module 10, the control module 20 and the CAD module 25.

Thus all sound sources 34 are made available to the stereo simulation module 11 by means of the interface module 15. In this case the interface module 15 preferably uses standard Ethernet technology. The management the I/Os takes place centrally in the core module 10. Corresponding ceiling reflections are also generated here and can be reproduced by means of ceiling-mounted loudspeakers 33*c*. Furthermore an assignment can take place for the horizontal and/or vertical arrangement of front loudspeaker 33*a* and wall-mounted loudspeaker 33*b*.

Because of the free scalability of the system 1 for simulating spatial sound, even in the case of greatly split spaces, it is possible to compensate for sound reflections. Moreover no symmetry of space or special geometry is presupposed. In this connection an annular band consisting of front loudspeaker 33*a* and wall-mounted loudspeaker 33*b* is mounted in a slightly raised position above the audience 51 at a spacing relative to one another which is optimised for the number and spatial sound. This spacing is variable and may be defined according to the requirements. In a concert hall the spacing for example in a front and central portion of a space 50, with respect to the audience, is approximately 1.5 m. In a rear portion of the space a large spacing may be chosen on the basis of the directional perception characteristics of a listener selected are being. In addition to the loudspeakers 33*a,* 33*b* mounted in a ring on the wall, in particular in the front and central portion of the space 50 the ceiling-mounted loudspeakers 33*c* together with microphones 35 which in particular also control the regenerative echo are mounted on the ceiling. Thus the digital audio/network system 30 can be used both as a system for variable extension of the echo time and also as a system for directional acoustic irradiation.

Figure 4:
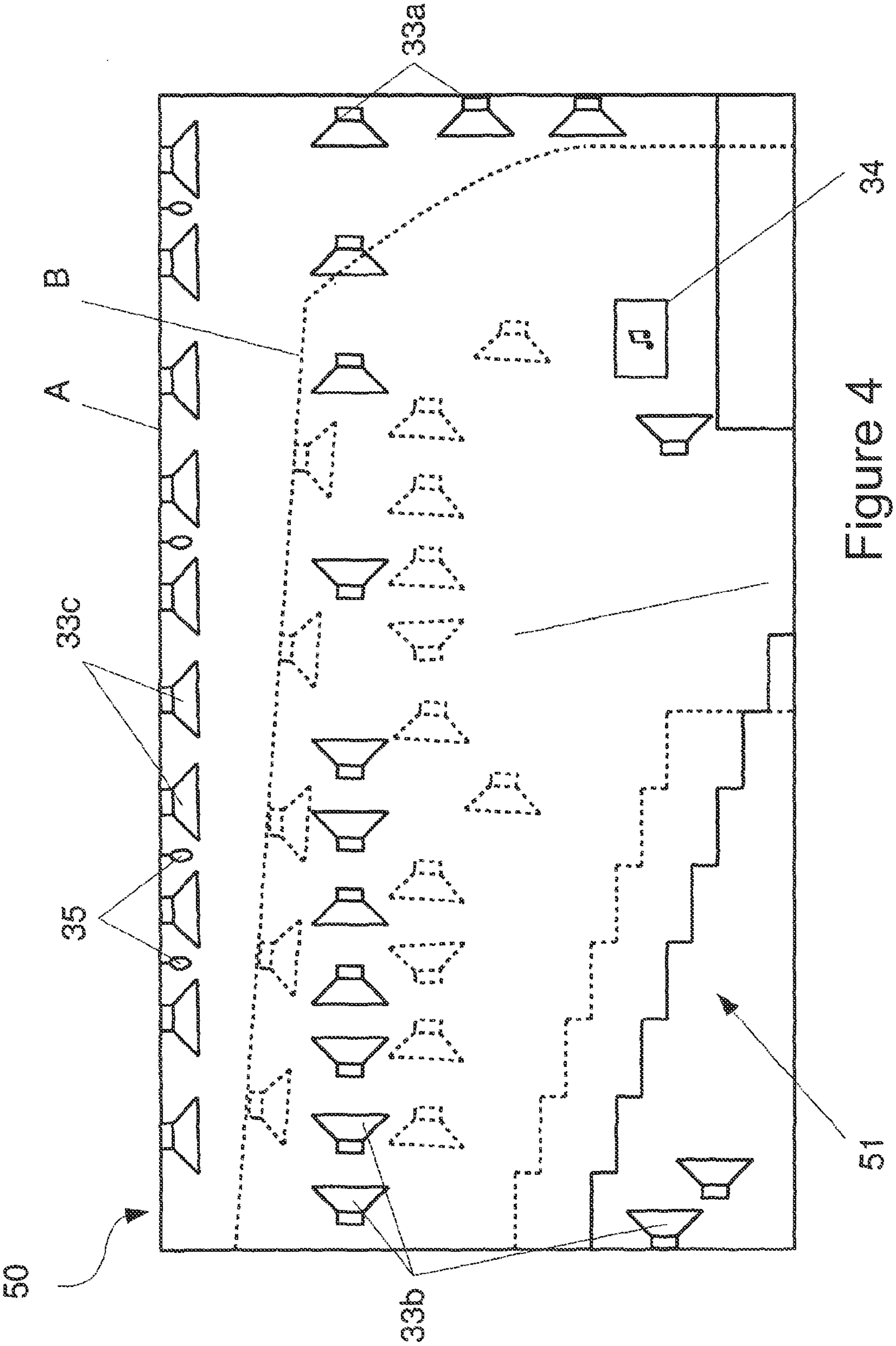
FIG. 4 shows a schematic representation of the system for simulating spatial sound with a stereo simulation according to the example of FIG. 1.
Figure 5:
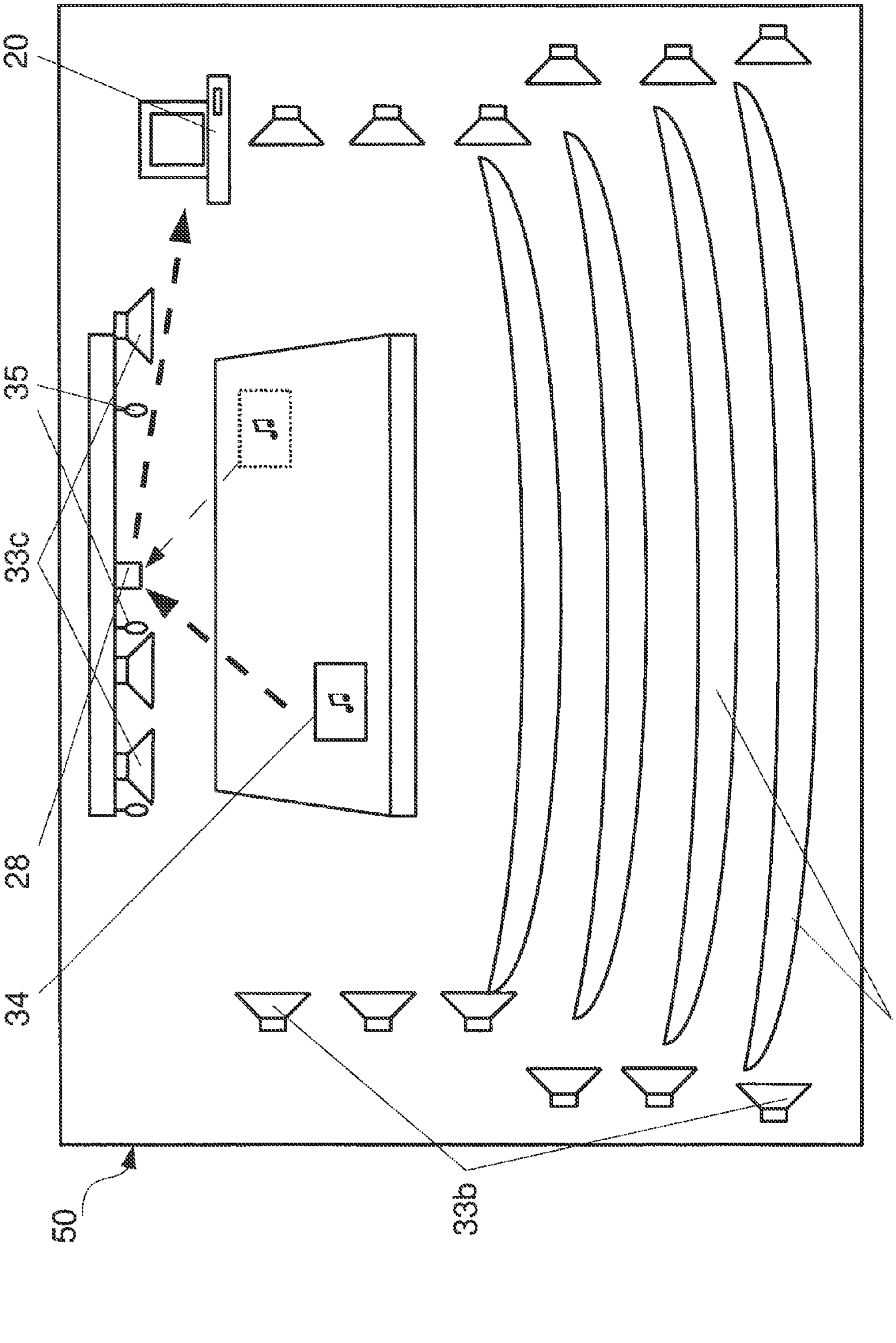
FIG. 5 shows a schematic representation of the system for simulating spatial sound with components of the tracking system and a sound source in various positions in relation to an audience according to an example.

FIG. 4 shows an example application of the ceiling-mounted loudspeakers 33*c,* wherein they are oriented on a logarithmic matrix R1 extending in the longitudinal direction of the space 50 which is of rectangular construction. In this case in the front portion of the space 50 the spacing of the ceiling-mounted loudspeakers 33*c* is smaller than in a central or rear portion of the space 50. This reflects the normal listening habits of an audience oriented in the direction of the actors and thus perceiving sound from the front more clearly than sound from the rear, so that the plurality of loudspeakers can be reduced towards the end of the hall. In circular spatial situations the ceiling-mounted loudspeakers can also be oriented on a logarithmic matrix R1 which extends from the audience to the actors.

A fundamental prerequisite for the variable extension of the echo time and the directional acoustic irradiation is a system latency of less than 2.5 ms. This covers the complete signal chain, from the sound source 34 to the loudspeakers.

In order to ensure a fast reaction time and a guaranteed data stream, a network, preferably cable-based, preferably an Ethernet topology, in particular according to the 1000BASE-T standard, is provided for the core module 10, control module 20, CAD module 25 and digital audio/network system 30. In this case for the cabling a gigabit cabling, for example to the CAT7 standard, can be chosen which is also suitable for 10 Gbit ethernet.

Since the system 1 for simulating spatial sound is intended to control a plurality of loudspeakers 33*a,* 33*b,* 33*c,* in particular up to 512 loudspeakers, a plurality of amplifier modules 31 may be needed. An amplifier module 31 simultaneously control a plurality of loudspeakers, in particular up to 8 loudspeakers. These amplifier modules 31 are in turn connected to the network by means of an I/O module 32. In each case an I/O module 32 provides freely combinable channels, in particular up to 16 channels, both for sound sources 34 and also amplifier modules 31.

Because of the required system latency, all network components, core module 10, control module 20, CAD module 25 and I/O modules 32 are connected to the network.

In order furthermore to keep the latency low and to provide a corresponding dedicated data stream per channel, each network component is connected by means of a port of a switch 36 to which the data stream can be addressed on the basis of the connected network component. Because of the requirements of the network for addressability and prioritisation on the basis of the limited latency, a switch which can evaluate and process higher transport levels of a protocol is used, in particular a layer 3 switch. Furthermore, the transmission of the audio data of the system as audio streams is prioritised for example by means of QoS (quality of service). Accordingly the data traffic for monitoring and management tasks acquires a lower priority than that of the audio streams. Thus a secure and fast transmission of the data packets is ensured. In addition a dedicated bandwidth is provided for each port of the switch 36. On the basis of the required I/O modules 32 and the necessary bandwidth, in particular from 1.7 to 3.4 Mbit/s or higher per channel, a plurality of switches 36 are provided in the network. In order to adhere to the latency period, the number of hops which a data packet runs through from the transmitter to the receiver is limited to a maximum of 7 hops.

With these prerequisites in terms of network and correspondingly further hardware for the further modules used, the absolutely necessary system latency of less than 2.5 ms for the entire system can be achieved. Thus spaces originally configured to be speech-oriented with minimum echo can be converted into orchestral spaces. Furthermore, feedback is almost eliminated.

The control module 20 connected by means of the switch 36 to the core module 10 can not only eliminate structurally induced acoustic weak points, such as for example niches, projections, surfaces etc., in existing spaces but also during the planning of a space can simulate the acoustic characteristics of the space which are to be expected. This is possible not only for a listener's position within the space, but encompasses the entire audience 51. The adjustment of the system is possible in different ways. For example as can be seen according to FIG. 3, the acoustically simulated and as yet non-existent space designated by the letter A can be changed so long as its contour approximates the broken line designated by the letter B. Thus the acoustic characteristics of a non-existent compartment can be simulated simply and quickly and expensive, significant acoustic errors can be avoided.

For perfect simulation of real movements and/or virtual movements with the system 1 for simulating spatial sound the core module 10 is controlled in particular by a tracking system 29. The tracking system 29 has a geodata transmitter 27 and a g 28. Thus for example the position of an actor (or of the sound source 34) is continuously determined and transmitted to the control module 20. Thus a movement of the actor can be acoustically converted and rendered audible for the audience from every position within the audience 51. In this connection FIG. 4 shows a scenario with two different positions of the sound source 34.

This three-dimensional system 1 for simulating spatial sound is universally applicable and is suitable in particular for seated events and for mobile purposes. By the use of standard loudspeakers a cost-effective, compact and efficient system has been developed, which can represent a realistic and three-dimensional sound scenario also without a closed wave field.

In this case the specified latency period of less than 2.5 ms relates to the complete signal chain integrated in the system, that is to say transmission by means of the network, echo matrix and processing (RQ, echo, etc.). This is achieved in particular with up to 512 connected loudspeakers.

Furthermore the three-dimensional system 1 for simulating spatial sound 1 is convincing due to an extended sweet spot and due to the possibility of live rendering. Thus the system can be used both in planetariums, cinemas and theme parks and also for live acoustic irradiation, for product presentations or three-dimensional audiovisual simulations.

Thus the system disclosed herein may offer the following:

Reduced number of loudspeakers.

Individual control of each loudspeaker in amplitude and time with an algorithm based on the wave field synthesis.

Realistic impression of sound from moving sound sources

The examples described herein serve merely for explanation and does not constitute any limitation of the scope of protection.

Figure 6:
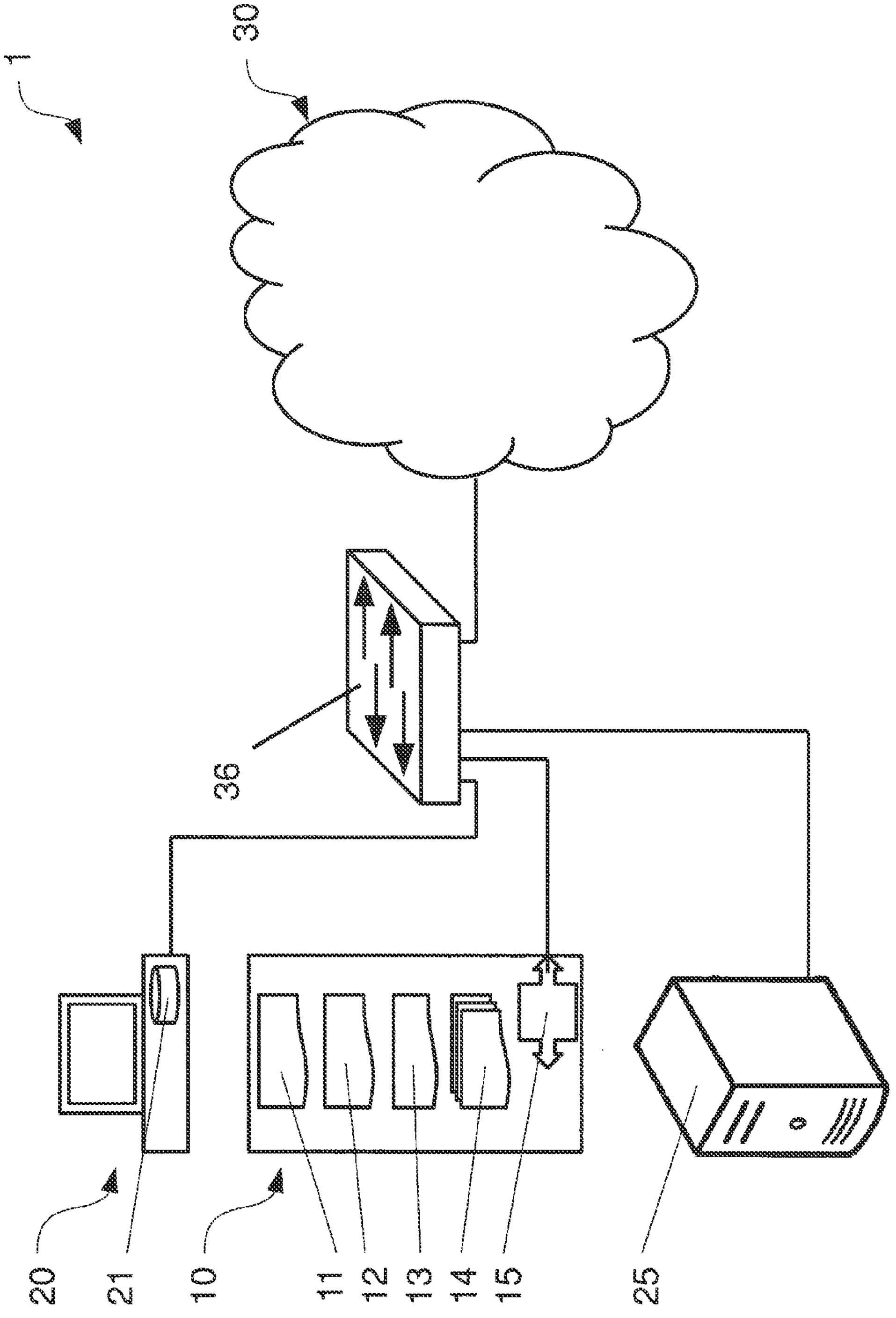
FIG. 6 shows a schematic representation of the system for simulating spatial sound according to another example.

FIG. 6 shows a second embodiment in which a control module 20 one comprises a digital audio delay matrix module 21.

FIG. 7 shows the orientation of the loudspeakers on a rectangular (FIG. 7*a*), rhomboid (FIG. 7*b*), or honeycomb matrix (FIG. 7*c*).

In a further example, space geometries, surfaces and entire spaces are simulated in terms of sound by means of a CAD module 25 connected to the core module 10 and/or control module 20. Thus already before the setting up of a space and/or building structurally induced acoustic weak points, such as for example niches, projections, surfaces etc., can be eliminated and the acoustic characteristics of the space which are to be expected can be simulated.

For example, in a further embodiment a digital audio/network system could be controlled by a separate computer. Furthermore, it is also conceivable that a freely scalable echo matrix is controlled by a separate computer.

It is also conceivable that ceiling-mounted loudspeakers 33*c* can also be oriented on a logarithmic matrix R2 extending in a transverse direction of a space 50.

In a further embodiment a smaller spacing than 1.5 m of front and wall-mounted loudspeakers is also conceivable on the basis of variable adjustment possibilities. FIG. 8 shows the correlation between the number of active loudspeakers and the size of the resulting sweet spot. With an increasing number of active loudspeakers the sweet spot and thus the region of a representative auditory impression is enlarged. On the other hand the number of loudspeakers is reduced to a total of only four active loudspeakers, then the sweet spot is concentrated on a point in the centre of the space, as can also be seen from FIG. 8*c*.

For increased safeguarding against failure a redundancy of all important system components is conceivable. In this case all necessary components are doubled.

It is also conceivable to use wireless routes for connections of individual components.

LIST OF REFERENCE SIGNS

1 system for simulating spatial sound
10 core module
11 stereo simulation module (RSM)
12 synthetic echo module
13 regenerative echo module
14 distributor module
15 interface module
20 control module
21 digital audio delay matrix module
25 CAD module
27 geodata transmitter
28 geodata receiver
29 tracking system
30 digital audio/network system
31 amplifier module
32 I/O module
33*a* front loudspeaker
33*b* wall-mounted loudspeaker
33*c* ceiling-mounted loudspeaker
34 sound source
35 microphone
36 switch
37 LAN cable
38 loudspeaker cable
39 microphone cable
50 space
51 audience
R1 matrix longitudinal direction
R2 matrix transverse direction

The invention claimed is:

1. A system for simulating spatial sound comprising:

a core module having a spatial simulation module, an echo module and an interface module, wherein sound sources are made available in the spatial simulation module by the interface module, a control module, a digital audio delay matrix module for calculation of spatial echo values; and a digital audio and network system, wherein the core module and the digital audio delay matrix module are connected via the interface module by a gigabit cabling to a switch, the control module and the digital audio and network system directly connected by the gigabit cabling to the switch for transmitting the audio data of the system as a prioritized audio stream based on a quality of service, wherein a dedicated bandwidth is provided for every port of the switch and a number of hops which a data packet runs through is limited to a maximum of 7 hops, so that a system latency less than 2.5 ms is achieved and an echo or a directional acoustic irradiation is provided, wherein the core module is controlled by the control module and has a synthetic echo module for generating a synthetic echo and a regenerative echo module controlled by a plurality of fixed microphones for generating a regenerative echo and that furthermore the digital audio and network system has an amplifier module and an I/O module by which up to 512 loudspeakers are spaced apart from another, but a smaller number of loudspeakers that in a system for Wellenfeld synthesis, are controlled, wherein the digital audio and network system comprises wall-mounted loudspeakers and ceiling-mounted loudspeakers, wherein a distance between the loudspeakers is substantially less than or equal to 1.5 m relative to one another.

2. The system of claim 1, wherein the echo or an extension of echo time and the directional acoustic irradiation in the core module are brought together sequentially or simultaneously.

3. The system of claim 1 wherein the loudspeakers are oriented on a rectangular, rhomboid or honeycomb matrix.

4. The system of claim 1, wherein the ceiling-mounted loudspeakers are oriented on a logarithmic matrix R1 extending in a longitudinal direction of a space.

5. The system of claim 1, wherein said system has a tracking system comprising a geodata transmitter and a geodata receiver in order to determine the position of a sound source in live operation and to deliver it to the control module.

6. The system of claim 5, wherein real movement or virtual movement of the sound source is converted and made audible for the audience by the tracking system.

7. The system of claim 1, wherein said system is configured by a Computer-Aided-Design module for simulating space geometries, surfaces and entire spaces in terms of sound.

8. The system of claim 1, wherein said system has sound insulation comprising acoustic panels or acoustic wall parts.

9. The system of claim 1 wherein the switch comprises a layer 3 switch.

10. A method for generating a simulation of spatial sound comprising:

a) transmitting control data of a control module to a spatial simulation module , wherein the core module has the spatial simulation module, an echo module and an interface module, wherein sound sources are made available in the spatial simulation module by the interface module;

b) generating a synthetic echo with a synthetic echo module;

c) generating a regenerative echo with a regenerative echo module;

d) combining the synthetic echo with the regenerative echo;

e) transmitting the audio data of the system as a prioritized audio stream by a layer 3 switch in conjunction with a digital audio and network system, wherein a dedicated bandwidth is provided for every port of the switch and a number of hops which a data packet runs through is limited to a maximum of 7 hops, so that a system latency less than 2.5 ms is achieved;

f) controlling, by an amplifier module and an I/O module, a plurality of loudspeakers spaced from one another, wherein the digital and network system comprises the amplifier module and the I/O module and wherein a number of loudspeakers of the plurality of loudspeakers does not exceed 512 loudspeakers and is smaller than for a system based on Wellenfeld synthesis; and g) reproducing a plurality of audio signals with regard to amplitude and time by the plurality of loudspeakers, wherein the digital audio and network system comprises wall-mounted loudspeakers and ceiling-mounted loudspeakers, and wherein a distance between the loudspeakers is substantially less than or equal to 1.5 m relative to one another.

11. The method of claim 10 further comprising c1) generating the regenerative echo by the regenerative echo module controlled by a plurality of fixed microphones.

12. The method of claim 10 further comprising a1) adapting and simulating spatial parameters by the control module;

a2) calculating the sound characteristics of a space by a three dimensional-capable Computer-Aided Design system; and a3) transmitting the control data of the control module to the core module.

13. The method of claim 10 further comprising:

producing a playback space which corresponds to a generating space acoustically including reverberation characteristics of the generating space.

14. One or more non-transitory computer-readable media having instructions stored thereon that, when executed, cause at least one computing device to:

a) transmit control data of a control module to a spatial simulation module, wherein the core module has the spatial simulation module, an echo module and an interface module, wherein sound sources are made available in the spatial stereo simulation module by the interface module;

b) generate a synthetic echo with a synthetic echo module;

c) generate a regenerative echo with a regenerative echo module;

d) combine the synthetic echo with the regenerative echo;

e) transmit the audio data of the system as a prioritized audio stream by a layer 3 switch in conjunction with a digital audio and network system, wherein a dedicated bandwidth is provided for every port of the switch and a number of hops which a data packet runs through is limited to a maximum of 7 hops, so that a system latency less than 2.5 ms is achieved;

f) control, by an amplifier module and an I/O module, a plurality of loudspeakers spaced from one another, wherein the digital and network system comprises the amplifier module and the I/O module and wherein a number of loudspeakers of the plurality of loudspeakers does not exceed 512 loudspeakers and is smaller than for a system based on Wellenfeld synthesis; and g) reproduce a plurality of audio signals with regard to amplitude and time by the plurality of loudspeakers, wherein the digital audio and network system comprises wall-mounted loudspeakers and ceiling-mounted loudspeakers, wherein a distance between the loudspeakers is substantially less than or equal to 1.5 m relative to one another.

15. The one or more non-transitory computer-readable media of claim 14, further comprising causing the at least one computing device to c1) generate the regenerative echo by the regenerative echo module controlled by a plurality of fixed microphones.

16. The one or more non-transitory computer-readable media of claim 14, further comprising causing the at least one computing device to:

a1) adapt and simulate spatial parameters by the control module;

a2) calculate the sound characteristics of a space by a three dimensional-capable Computer Aided Design system; and a3) transmit the control data of the control module to the core module.

17. The one or more non-transitory computer-readable media of claim 14, further comprising causing the at least one computing device to produce a playback space which corresponds to a generating space acoustically including reverberation characteristics of the generating space.

* * * * *